(12) United States Patent
Suzuki (10) Patent No.: US 10,186,537 B2
(45) Date of Patent: Jan. 22, 2019

(54) PIXEL UNIT AND IMAGING DEVICE

(71) Applicant: Atsushi Suzuki, Hyogo (JP)

(72) Inventor: Atsushi Suzuki, Hyogo (JP)

(73) Assignee: Ricoh Company Ltd., Tokyo (JP)

( * ) Notice: Subject to any disclaimer, the term of this patent is extended or adjusted under 35 U.S.C. 154(b) by 0 days.

(21) Appl. No.: 15/437,850

(22) Filed: Feb. 21, 2017

(65) Prior Publication Data

US 2017/0256575 A1    Sep. 7, 2017

(30) Foreign Application Priority Data

Mar. 7, 2016   (JP) .................................. 2016-043816

(51) Int. Cl.
  *H01L 27/14*       (2006.01)
  *H01L 27/146*      (2006.01)
(52) U.S. Cl.
  CPC .... *H01L 27/14614* (2013.01); *H01L 27/1461* (2013.01); *H01L 27/14636* (2013.01)
(58) Field of Classification Search
  CPC ........... H01L 27/1461; H01L 27/14614; H01L 27/14636
  See application file for complete search history.

(56) References Cited

U.S. PATENT DOCUMENTS

| | | | |
|---|---|---|---|
| 8,471,315 B1 * | 6/2013 | Hynecek ........... | H01L 27/14603 257/233 |
| 8,878,973 B2 | 11/2014 | Kawata | |
| 8,957,996 B2 | 2/2015 | Kajihara et al. | |
| 8,988,571 B2 | 3/2015 | Sugawa et al. | |
| 2003/0227039 A1 * | 12/2003 | Umeda ............. | H01L 27/14603 257/291 |
| 2007/0252184 A1 | 11/2007 | Ohkawa | |
| 2009/0140304 A1 * | 6/2009 | Kudoh .............. | H01L 27/14603 257/292 |

(Continued)

FOREIGN PATENT DOCUMENTS

| | | |
|---|---|---|
| JP | 2003-188367 | 7/2003 |
| JP | 2003-258231 | 9/2003 |
| JP | 2005-101442 | 4/2005 |

(Continued)

OTHER PUBLICATIONS

Japanese Office Action for 2016-043816 dated Nov. 6, 2018.

*Primary Examiner* — Joseph Galvin, III
(74) *Attorney, Agent, or Firm* — IPUSA, PLLC (57) ABSTRACT

An pixel unit includes a photoelectric conversion element, a transfer transistor having a transfer gate abutting on the photoelectric conversion element, and a floating diffusion region on which the transfer gate abuts, wherein the transfer gate includes a first gate portion having a first gate width in a gate width direction, the first gate portion abutting on the floating diffusion region and extending away from the floating diffusion region in a gate length direction, and a second gate portion having a second gate width narrower than the first gate width in the gate width direction, the second gate portion extending continuously from the first gate portion in the gate length direction, and wherein a width of the second gate portion gradually decreases from the first gate width to the second gate width toward a direction away from the first gate portion.

11 Claims, 9 Drawing Sheets

(56) References Cited

U.S. PATENT DOCUMENTS

2015/0357370 A1* 12/2015 Yamaguchi ....... H01L 27/14689
438/60

FOREIGN PATENT DOCUMENTS

| JP | 3730442 | 1/2006 |
| JP | 2012-039299 | 2/2012 |
| JP | 4931160 | 5/2012 |
| JP | 2013-225774 | 10/2013 |
| JP | 5521758 | 6/2014 |
| JP | 2015-106908 | 6/2015 |
| JP | 2015-130533 | 7/2015 |

* cited by examiner

PIXEL UNIT AND IMAGING DEVICE

CROSS-REFERENCE TO RELATED APPLICATIONS

The present application claims priority under 35 U.S.C. § 119 to Japanese Patent Application No. 2016-043816, filed on Mar. 7, 2016, the contents of which are incorporated herein by reference in their entirety.

BACKGROUND OF THE INVENTION

1. Field of the Invention

The disclosures herein relate to a pixel unit and an imaging device.

2. Description of the Related Art

Solid-state imaging devices such as CMOS (i.e., complementary metal-oxide semiconductor) imaging sensors are manufactured by use of a typical semiconductor manufacturing process. A single chip may be configured to have both an analog circuit and a digital circuit implemented therein. Significant advantages such as reduction of the number of peripheral ICs may thus be achievable.

A solid-state imaging device includes a pixel unit having a plurality of arranged pixels and peripheral circuits disposed in the surrounding area of the pixel unit. Each pixel includes a photoelectric conversion element (PD) such as a photodiode, pixel transistors of various types, and a floating diffusion (FD) region for converting electric charge obtained through photoelectric conversion into voltage. A transfer transistor (TX) included in the pixel transistors has a transfer gate (TG) for transferring electric charge from the PD region to the FD region for read-out.

Some related-art solid-state imaging devices have a structure characterized by an extended part which is formed by extending a portion of the gate of a transfer transistor from the main part of the gate toward the PD region.

SUMMARY OF THE INVENTION

In one embodiment, an pixel unit includes a photoelectric conversion element, a transfer transistor having a transfer gate abutting on the photoelectric conversion element, and a floating diffusion region on which the transfer gate abuts, wherein the transfer gate includes a first gate portion having a first gate width in a gate width direction, the first gate portion abutting on the floating diffusion region and extending away from the floating diffusion region in a gate length direction, and a second gate portion having a second gate width narrower than the first gate width in the gate width direction, the second gate portion extending continuously from the first gate portion in the gate length direction, and wherein a width of the second gate portion gradually decreases from the first gate width to the second gate width toward a direction away from the first gate portion.

BRIEF DESCRIPTION OF THE DRAWINGS

Other objects and further features of embodiments will be apparent from the following detailed description when read in conjunction with the accompanying drawings.

DESCRIPTION OF THE PREFERRED EMBODIMENTS

Problems to be Solved by Embodiments

A related-art imaging device has an extended part relative to the main part of a transfer gate, and the existence of such an extended part ends up reducing the area size of the PD region. This configuration causes the number of saturated electrons in the PD region to decrease, which results in insufficient amount of light input. Further, the existence of a portion having a different gate size (gate length in particular) in the transfer gate causes the distance (i.e., the gate length of the transfer transistor TX) from the PD region to the FD region to be uneven, thereby generating variation in the electric potential of the FD region at points (proximity points) close to the transfer transistor TX.

With such variation in electric potential, a lengthy time is required for electric charge to move from a point in the PD region at a distance from the transfer transistor TX to a point abutting on the transfer transistor TX. As a result, degradation of the transfer characteristics may occur. In this manner, the structure of the related-art solid-state imaging device may cause a detrimental effect on the transfer characteristics. There may thus be a need for an imaging device that has improved transfer characteristics while securing sufficient light input.

Embodiments

Figure 1:
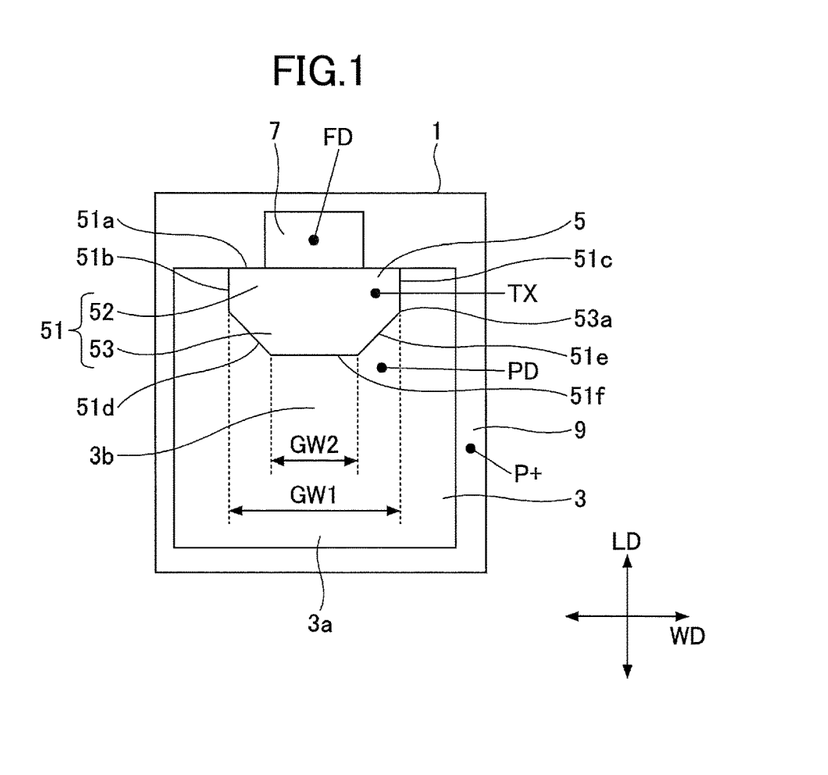
FIG. 1 is a drawing illustrating an example of a pixel unit according to a first embodiment.

In the following, embodiments will be described by referring to the accompanying drawings. In these drawings, the same or corresponding elements are referred to by the same or corresponding numerals, and a description thereof will be omitted. FIG. 1 is a drawing illustrating the structure of a pixel that is an example (i.e., first embodiment) of a pixel unit. A pixel 1 includes a photodiode 3, a transistor 5, and a diffusion region 7.

The photodiode 3, which is electrically coupled to the transistor 5, has the function to convert incident light into electric charge. Although not illustrated, the photodiode 3 is configured as a pinned photoelectric conversion element such that an n-type semiconductor region (n+) serving as an electric charge accumulation region is formed in a p-type semiconductor well, with a p-type semiconductor region (p+) formed on the n-type semiconductor region.

The photodiode 3 is an example of a photoelectric conversion element included in the pixel unit.

The transistor 5, which is electrically coupled to the photodiode 3, has a gate 51 abutting on the photodiode 3. The transistor 5 is coupled to the photodiode 3 via a channel under the gate 51. The transistor 5 has the function to transfer electric charge converted by the photodiode 3 to the diffusion region 7.

The transistor 5 is an example of a transfer transistor included in the pixel unit. Further, the gate 51 of the transistor 5 is an example of a transfer gate constituting the transfer transistor.

The diffusion region 7 abuts on the gate 51 of the transistor 5 such that the transistor 5 is placed between the photodiode 3 and the diffusion region 7, and is electrically coupled to the transistor 5. The plan shape of the diffusion region 7 is a quadrilateral such as a rectangle, a square, or the like. The diffusion region 7 contains diffused impurities to form a n-type semiconductor region (n+). The diffusion region 7 corresponds to the drain of the transistor 5, which accumulates electric charge transferred through the transistor 5.

The photodiode 7 is an example of a floating diffusion region included in the pixel unit.

The pixel unit of FIG. 1 further includes a device isolation region 9 surrounding the photodiode 3, the transistor 5, and the diffusion region 7. The device isolation region 9, which is formed as a p-type semiconductor region (p+ region), may have a portion extending in the channel area of the gate 51 of the transistor 5 (i.e., extending under the gate 51 of the transistor 5).

The provision of the device isolation region 9 serves to electrically isolate the photodiode 3, the transistor 5, and the diffusion region 7 of the pixel 1 from another pixel 1.

Further, the gate 51 of the transistor 5 includes a first gate portion 52 and a second gate portion 53 that have different gate widths. The first gate portion 52, which has a first gate width GW1 in the gate width direction WD, abuts on the diffusion region 7 and extends away from the diffusion region 7 in the gate length direction LD.

The gate length direction LD refers to the direction in which carriers move in the channel when the transistor 5 operates, and lies in the vertical direction of FIG. 1. The gate width direction WD refers to the direction perpendicular to the gate length direction LD, and lines in the horizontal direction of FIG. 1. Namely, the direction in which the first gate portion 52 extends (i.e., the gate length direction LD in which the first gate portion 52 extends away from the diffusion region 7) refers to the downward vertical direction of FIG. 1.

The second gate portion 53, which has a second gate width GW2 narrower than the first gate width GW1 in the gate width direction WD, extends continuously from the first gate portion 52 in the gate length direction LD. The second gate portion 53 extending continuously from the first gate portion 52 may be formed seamlessly with the first gate portion 52 as part of a unitary, continuous piece, or may be formed as a distinct member separate from the first gate portion 52.

The width of the second gate portion 53 gradually decreases from the first gate width GW1 to the second gate width GW2 toward the direction away from the first gate portion 52. The direction away from the first gate portion 52 is the downward vertical direction of FIG. 1 similarly to the direction in which the first gate portion 52 extends (i.e., the gate length direction LD in which the first gate portion 52 extends away from the diffusion region 7).

Namely, the gate width of the gate 51 is constant in the first gate portion 52 (i.e., equal to the first gate width GW1), and gradually decreases in the second gate portion 53 toward the tip (i.e., side 51f) of the second gate portion 53 from a vicinity 53a of the first gate portion 52.

In other words, the gate width of the second gate portion 53 decreases from the first gate width GW1 to the second gate width GW2 toward the tip (i.e., side 51f) of the second gate portion 53 as the second gate portion 53 extends from the vicinity 53a of the first gate portion 52.

The gate 51 in FIG. 1 is situated between the photodiode 3 and the diffusion region 7. The diffusion region 7, which has a width narrower than the first gate width GW1, abuts on an end 51a of the gate 51 (i.e., the first gate portion 52) through this narrower width.

The gate 51 in FIG. 1 is situated between the photodiode 3 and the diffusion region 7. The diffusion region 7, which has a width narrower than the first gate width GW1, abuts on an edge 51a of the gate 51 (i.e., the first gate portion 52) through this narrower width.

The arrangement in which the photodiode 3 surrounds the gate 51 of the transistor 5 having such a shape, except for the edge 51a abutting on the diffusion region 7, allows the photodiode 3 to have a large area size without the need to increase the entire size of the pixel 1. With this arrangement, a sufficient amount of light input into the photodiode 3 is secured, and so is a sufficient number of saturated electrons, despite the provision of the gate 51 of the transistor 5.

Moreover, the above-described shape of the gate 51 of the transistor 5 serves to ensure that the distance from the photodiode 3 to the diffusion region 7 is almost constant regardless of the position. As a result, electric potential within the area of the photodiode 3 is made positive from a distant area 3a away from the transistor 5 to a vicinity area 3b next to the transfer transistor.

Consequently, the transfer electric field within the area of the photodiode 3 is improved between the distant area 3a away from the transistor 5 and the vicinity area 3b next to the transfer transistor (i.e., without the occurrence of a reverse electric field). The transfer characteristics of the imaging device is thus improved.

The gate 51 of the transistor 5 preferably has a taper shape in the second gate portion 53 as illustrated in FIG. 1. The provision of such a tapering gate 51 between the photodiode 3 and the diffusion region 7 serves to provide a substantially constant distance between the photodiode 3 and the diffusion region 7.

Consequently, the provision of the tapering gate 51 serves to keep a positive electric potential from the photodiode 3 to the gate 51 of the transistor 5 (i.e., from the distant area 3a to the vicinity area 3b in the photodiode 3). Since this arrangement enables the improvement of a transfer electric field in the area of the photodiode 3, the provision of the tapering gate 51 serves to improve the transfer characteristics of the imaging device.

The plan shape of the gate 51 is preferably formed by cutting off two of the four corners of a rectangle on the far side thereof from the diffusion region 7 as illustrated in FIG. 1. Specifically, the plan shape of the gate 51 is constituted by six sides and six vertices as illustrated in FIG. 1. The side that faces toward the diffusion region 7 among the six sides corresponds to the edge 51a of the gate 51 (i.e., the first gate portion 52) that abuts on the diffusion region 7.

Two of the remaining five sides are sides 51b and 51c that are part of the first gate portion 52. The sides 51b and 51c each meeting the side 51a are situated opposite to each other in the width direction WD. The remaining three sides are sides 51*d*, 51*e*, and 51*f* that are part of the second gate portion 53. The sides 51*d* and 51*e* of these three sides meet the sides 51*b* and 51*c*, respectively, and are situated opposite to each other in the gate width direction WD while extending at an angle relative to the gate length direction LD.

The side 51*f*, which meets both the sides 51*d* and 51*e*, is situated opposite to the side 51*a* in the gate length direction LD. These three sides (i.e., sides 51*d*, 51*e*, and 51*f*) together form the shape of the second gate portion 53 whose width gradually decreases from the first gate width GW1 to the second gate width GW2. In other words, these three sides (i.e., sides 51*d*, 51*e*, and 51*f*) together form the tapered second gate portion 53.

In FIG. 1, the gate 51 is placed between the photodiode 3 and the diffusion region 7 such that the five sides thereof (i.e., sides 51*b* through 51*f*), except for the side 51*a*, abut on the photodiode 3. Namely, the photodiode 3 surrounds the gate 51 on the five sides (i.e., sides 51*b* through 51*f*) thereof, except for the side 51*a*.

The provision of the tapering gate 51 having such a shape between the photodiode 3 and the diffusion region 7 serves to provide a substantially constant distance between the photodiode 3 and the diffusion region 7 with high precision.

Accordingly, electric potential is consistently kept at a positive level from the photodiode 3 to the gate 51 of the transistor 5 (i.e., from the distant area 3*a* to the vicinity area 3*b* in the photodiode 3). Since this arrangement enables the consistent improvement of a transfer electric field in the area of the photodiode 3, the provision of such a gate 51 reliably improves the transfer characteristics of the imaging device.

In the example illustrated in FIG. 1, the plan shape of the gate 51 is a hexagon, all the six sides of which are straight line segments. However, the six sides of the gate 51 are not limited to straight line segments. For example, the two sides (i.e., sides 51*d* and 51*e*) that are part of the tapered second gate portion 53 among the six sides, or one of these two, may be a curved line segment.

Moreover, the photodiode 3, the gate 51 of the transistor 5, and the diffusion region 7 are preferably aligned in line. This arrangement serves to provide a constant distance from the photodiode 3 to the diffusion region 7 through the gate 51 of the transistor 5 with yet higher precision.

Figure 2:
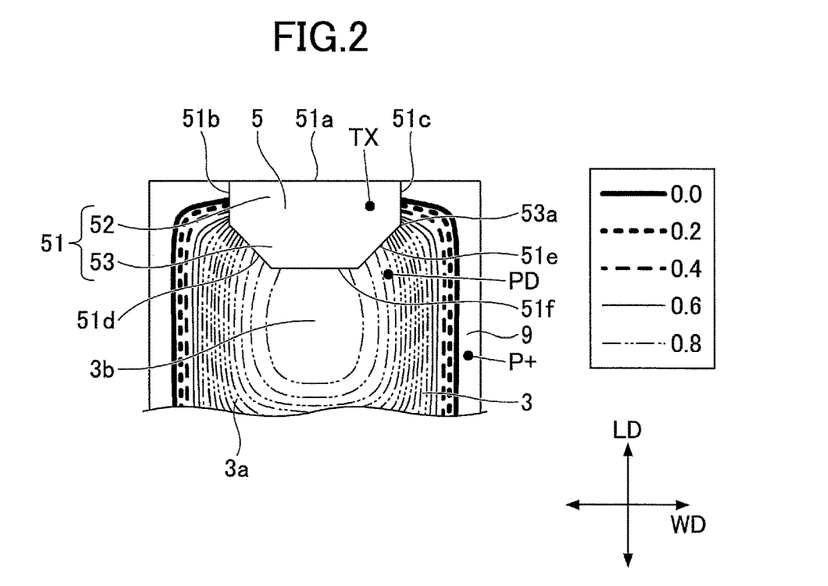
FIG. 2 is a drawing illustrating the electric field of the example of the pixel unit.

FIG. 2 is a drawing illustrating the state of an electric field of the photoelectric conversion element in the example of the pixel unit constituting the imaging device. FIG. 2 illustrates an electric potential observed at the time of transferring electric charge from the photoelectric conversion element disposed in the pixel unit.

As can be seen in FIG. 2, electric potential is distributed such that the maximum electric potential extends from the vicinity area 3*b* of the photodiode 3 situated in the vicinity of the transistor 5 to the distant area 3*a* of the photodiode 3 situated away from the transistor 5.

As viewed from a different angle, the electric filed is consistently positive from the distant area 3*a* to the vicinity area 3*b* in the area of the photodiode 3. It follows that there is no reverse electric field from the distant area 3*a* to the vicinity area 3*b* in the area of the photodiode 3. In this manner, FIG. 2 shows that there is an improvement in transfer characteristics as a result of the provision of the gate 51 that makes insufficient transfer unlikely to happen. Here, the term "insufficient transfer" refers to the situation in which some electric charge is left unused in the area of the photodiode 3.

Figure 3:
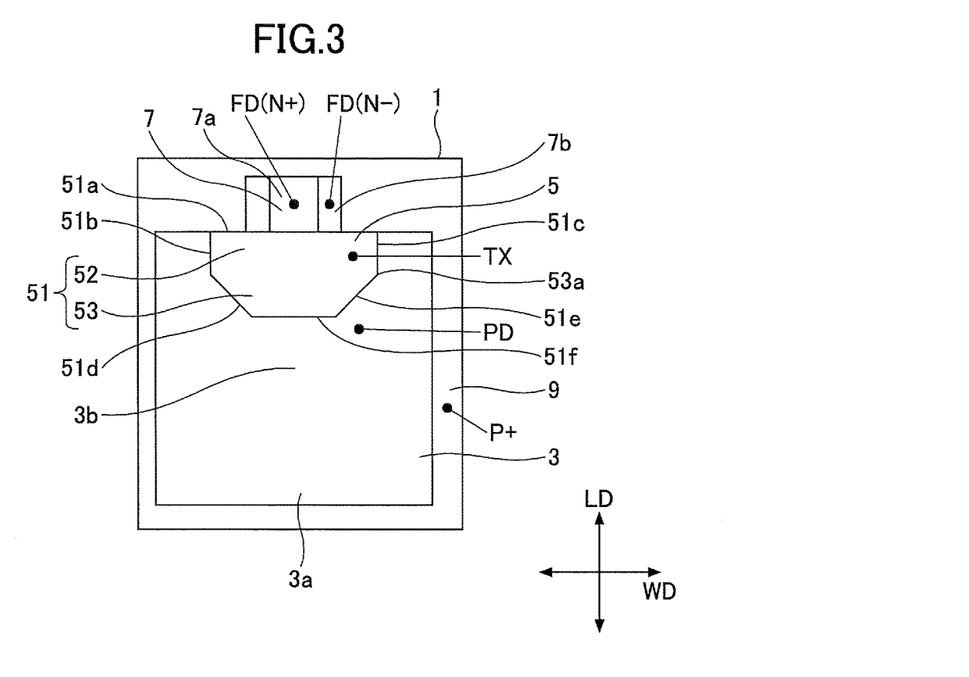
FIG. 3 is a drawing illustrating an example of a pixel unit according to a second embodiment.

FIG. 3 is a drawing illustrating an example of the pixel unit constituting an imaging device according to a second embodiment. In the pixel 1 of FIG. 3, the diffusion region 7 includes two regions having respective, different diffused impurity concentrations. The region having higher impurity concentration is a high concentration region 7*a*, and the region having lower impurity concentration is low concentration regions 7*b*.

The impurity concentration of the high concentration region 7*a* may be $1 \times 10^{19}$ cm$^{-3}$ or higher. The impurity concentration of the low concentration regions 7*b* may be lower than $1 \times 10^{19}$ cm$^{-3}$.

The high concentration region 7*a* is a high-impurity-concentration region (N+), and is in contact with the bottom of the gate 51 of the transistor 5. The low concentration regions 7*b*, which are situated next to the high concentration region (N+), are in contact with the gate 51 of the transistor 5. The low concentration regions 7*b* are regions (N−) having lower impurity concentration than the high concentration region (N+).

The high concentration region 7*a* is an example of a first diffusion region among the diffusion regions of the pixel unit constituting the imaging device. The low concentration regions 7*b* are an example of second diffusion regions among the diffusion regions.

The provision of the high concentration region and the low concentration regions allows the electric charge transferred through the transistor 5 to move easily to the low concentration regions having a shallow potential. The electric potential moved to the low concentration regions having a shallow potential are then accumulated in the high concentration region having a deep potential, which serves to suppress the reduction of transfer efficiency. With this arrangement, the junction capacitance (i.e., diffusion capacitance) of the diffusion region 7 may be reduced, thereby improving the conversion efficiency of an imaging device.

Further, the device isolation region 9 is likely to have crystal defects (or lattice defects) therein due to the characteristics of CMOS manufacturing. Placing the device isolation region 9 in contact with the diffusion region, especially with the high concentration region 7*a*, may make it easier for dark current to flow, resulting in the degradation of conversion efficiency.

In consideration of this, the low concentration regions 7*b* are preferably situated at such positions as to separate the high concentration region 7*a* from the device isolation region 9, i.e., preferably situated between the high concentration region 7*a* and the device isolation region 9 as illustrated in FIG. 3. The placement of the low concentration regions 7*b* at such positions enables the suppression of dark current, thereby reducing a decrease in conversion efficiency.

In the plan view shown in FIG. 3, the low concentration regions 7*b* are placed in contact with, and on both sides of, the high concentration region 7*a*. Such an arrangement of the low concentration regions 7*b* with respect to the high concentration region 7*a* enables the low concentration regions 7*b* to be situated in the proximity of the contact point of the diffusion region 7 that is in contact with the transfer transistor (i.e., the point where dark current is likely to flow). Accordingly, the occurrence of dark current is suppressed while reducing the diffusion capacitance of the diffusion region 7, which may reliably improve conversion efficiency.

Further, since the point of the diffusion region 7 in contact with the transistor 5 is constituted by the high concentration region 7*a* and the low concentration regions 7*b*, the source of the diffusion region 7 may be made to have a large area. As a result, the transfer characteristics of electric charge may also be improved.

The impurity concentration of the low concentration regions 7b of the diffusion region 7 is lower than in a low concentration region having a typical LDD (lightly doped drain) structure. Further, the low concentration regions 7b have a larger area size than a low-impurity-concentration region that may be naturally formed in the proximity of a junction when a typical PN junction is formed.

Part of the high concentration region 7a of the diffusion region 7, as connected to the transistor 5, constitutes a contact area that is part of the transistor 5. In other words, this part of the transistor 5 doubles as part of the high concentration region 7a of the diffusion region 7.

The high concentration region 7a is substantially unnecessary in areas other than the contact area. In the case of manufacturing by use of a typical CMOS process, a process of doping impurity by use of a resist mask creates the high concentration region 7a. The area size of the high concentration region 7a is thus made substantially larger than the contact area size of the contact area. On the other hand, an increase in the area size of the diffusion region 7 may increase the diffusion capacitance (i.e., junction capacitance) at the floating diffusion, thereby causing reduction in conversion efficiency.

In the present example, the diffusion region 7 and the transistor 5 share the n-type high concentration region 7a, such that the high concentration region 7a also serves as the contact area of the transistor 5 at which the diffusion region 7 is coupled to the channel under the gate 51 of the transistor 5 (i.e., the region where electric charge is likely to be accumulated in effect), as illustrated in FIG. 3. The distribution of impurity concentration is set such that the remaining area of the diffusion region 7 serves as the n-type low concentration regions 7b.

Compared with the high concentration region 7a, the junction capacitance of the low concentration regions 7b is extremely low. Because of this, the junction capacitance of the diffusion region 7 as a whole is made small, resulting in improvements in conversion efficiency. Further, electric charge transferred from the photodiode 3 to the low concentration regions 7b having a shallow potential in the diffusion region 7 is then collected in the high concentration region 7a having a deep potential, which serves to maintain transfer efficiency.

Figure 4:
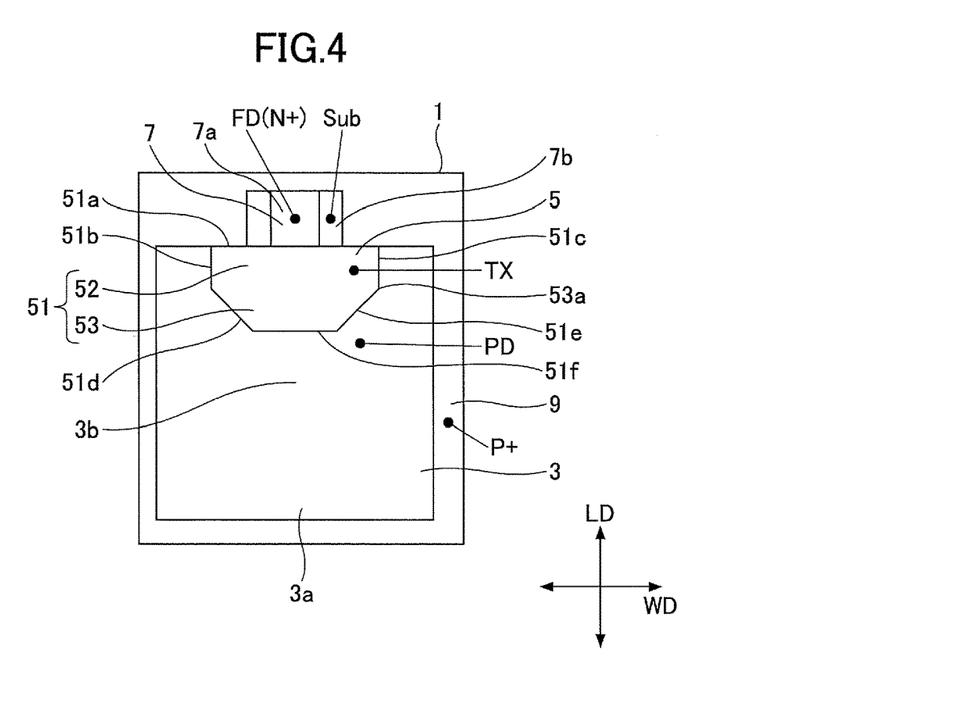
FIG. 4 is a drawing illustrating an example of a pixel unit according to a third embodiment.

FIG. 4 is a drawing illustrating an example of the pixel unit constituting an imaging device according to a third embodiment. In the pixel 1 illustrated in FIG. 4, a portion of the semiconductor substrate Sub forms the low concentration regions 7b. The area size of this portion of the semiconductor substrate Sub is substantially equal to the area size of the low concentration area (N−) illustrated in FIG. 1.

The semiconductor substrate Sub has an impurity concentration that is substantially lower than the impurity concentration of a high concentration area. The use of portions of the semiconductor substrate Sub to form the low concentration regions 7b of the diffusion region 7 serves to reduce the diffusion capacitance of the diffusion region 7. Accordingly, the junction capacitance of the diffusion region 7 as a whole is made small, resulting in improvements in conversion efficiency.

Moreover, the use of portions of the semiconductor substrate Sub as the low concentration regions 7b eliminates the need to use another member for forming a low concentration region at the floating diffusion. In other words, a conventional CMOS manufacturing process (such as etching, etc.) may be used to form the low concentration regions, thereby reducing manufacturing costs.

Figure 5:
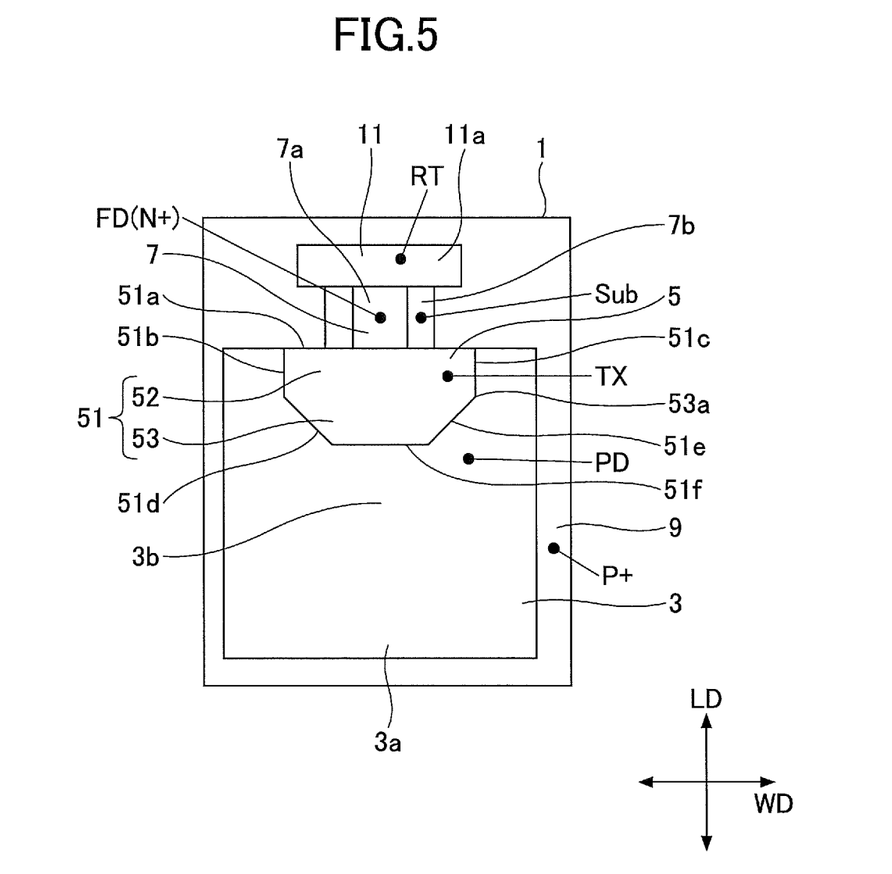
FIG. 5 is a drawing illustrating an example of a pixel unit according to a fourth embodiment.

FIG. 5 is a drawing illustrating an example of the pixel unit constituting an imaging device according to a fourth embodiment. The pixel 1 in FIG. 5 includes a transistor 11. The transistor 11 is electrically coupled to the diffusion region 7. The transistor 11 serves to reset (thereby making a voltage change to) the potential of electric charge accumulated in the diffusion region 7 to a reset potential.

The transistor 11 has a reset gate 11a constituting the contact part that is in contact with the diffusion region 7. The reset gate 11a is disposed such that the diffusion region 7 is placed between the reset gate 11a and the gate 51 of the transistor 5. The transistor 11 is an example of the reset transistor.

The provision of the transistor 11 allows the diffusion region 7 to serve as the source of the transistor 11. The diffusion region 7 also serves as the drain of the transistor 5. As a result, the source of the transistor 11 and the drain of the transistor 5 are consolidated at the FD region. This arrangement serves to reduce the diffusion capacitance of the diffusion region 7. Accordingly, the junction capacitance of the diffusion region 7 as a whole is made small, resulting in improvements in conversion efficiency.

Figure 6:
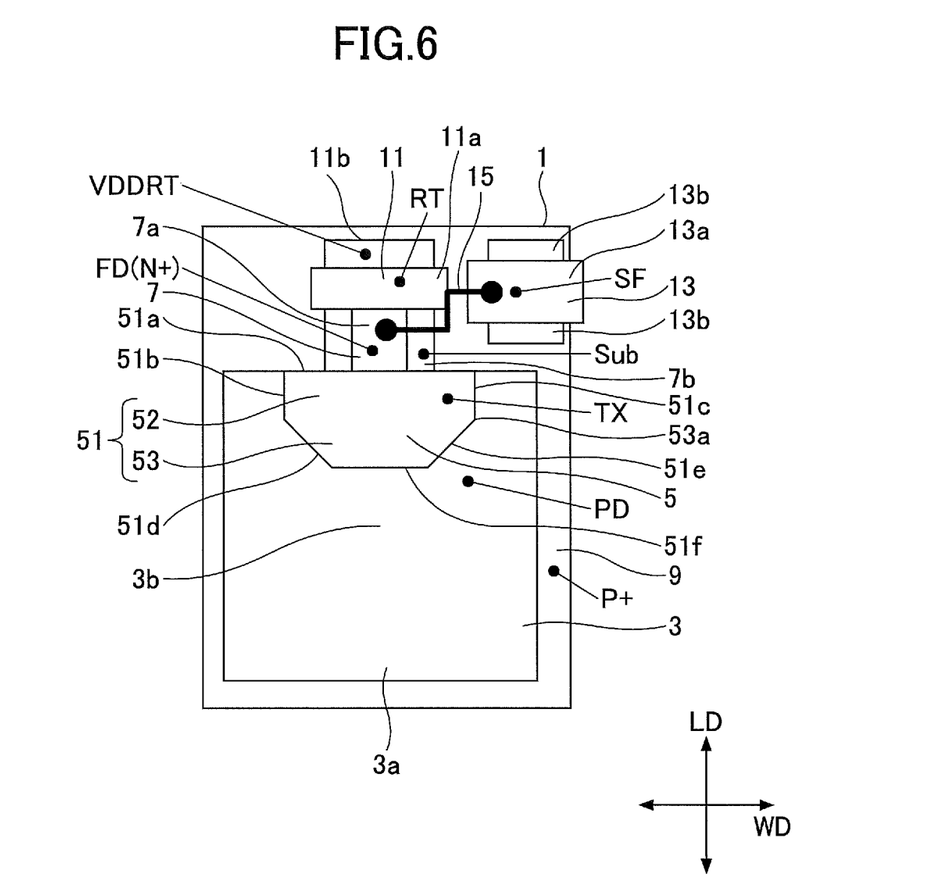
FIG. 6 is a drawing illustrating an example of a pixel unit according to a fifth embodiment.

FIG. 6 is a drawing illustrating an example of the pixel unit constituting an imaging device according to a fifth embodiment. The pixel 1 in FIG. 6 further includes a transistor 13.

The transistor 13 amplifies a signal voltage made through the transfer and conversion of electric charge at the diffusion region 7. The transistor 13 is an example of the amplifier transistor.

The transistor 13 includes an amplifier gate 13a and drain/source diffusion regions 13b. The amplifier gate 13a brings about a gate capacitance component among the entire capacitance of the diffusion region 7. The amplifier gate 13a is coupled to the high concentration region 7a of the diffusion region 7 through a metal interconnect 15. A diffusion region 11b of the transistor 11 is also illustrated to which a reset voltage is applied.

The provision of the transistor 13 serves to further improve the transfer characteristics of the pixel and to reduce the capacitance of the diffusion region, thereby improving conversion efficiency. Moreover, the provision of such a transistor 13 allows the amplified electric signal to be sent to the outside, thereby allowing a plurality of pixels to be easily combined into an imaging device.

Figure 7:
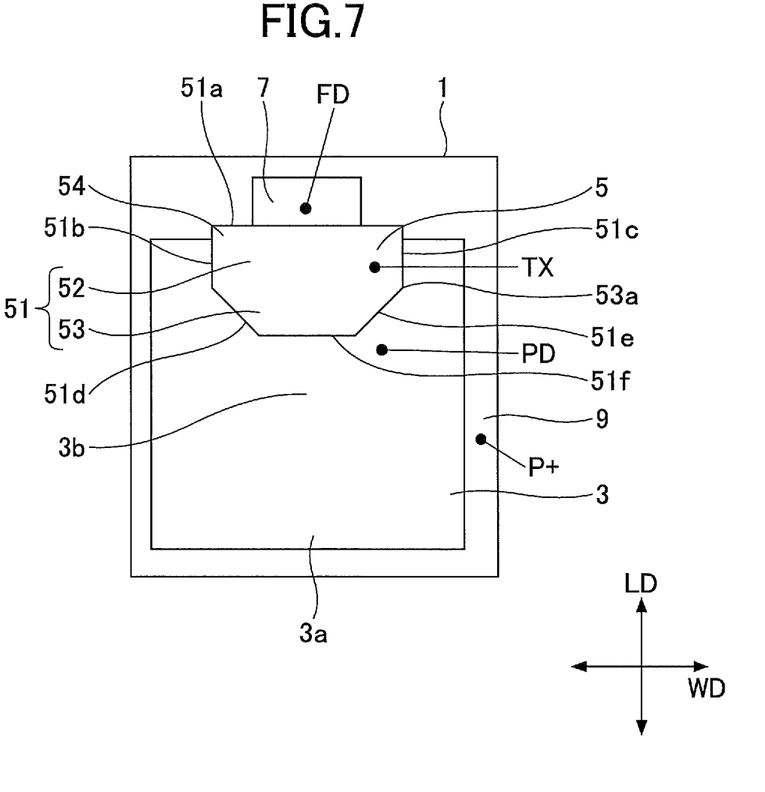
FIG. 7 is a drawing illustrating an example of a pixel unit according to a sixth embodiment.

FIG. 7 is a drawing illustrating an example of the pixel unit constituting an imaging device according to a sixth embodiment. In the pixel 1 illustrated in FIG. 7, the transistor 5 has a portion thereof extending toward the diffusion region 7 as an extension part 54 in comparison with the configuration in FIG. 1. As illustrated in FIG. 7, the extension part 54 is an edge of the transistor 5 situated toward the diffusion region 7 and projecting toward the diffusion region 7, thereby overlapping part of the diffusion region 7. The provision of the extension part 54 serves to reduce the size of the diffusion region 7.

Namely, the extension part 54 constitutes the area (i.e., contact area) at which a portion of the diffusion region 7 is in contact with the transistor 5, and the part of the transistor 5 becomes the part of the diffusion region 7, which serves to reduce the area size of the diffusion region 7.

Figure 8:
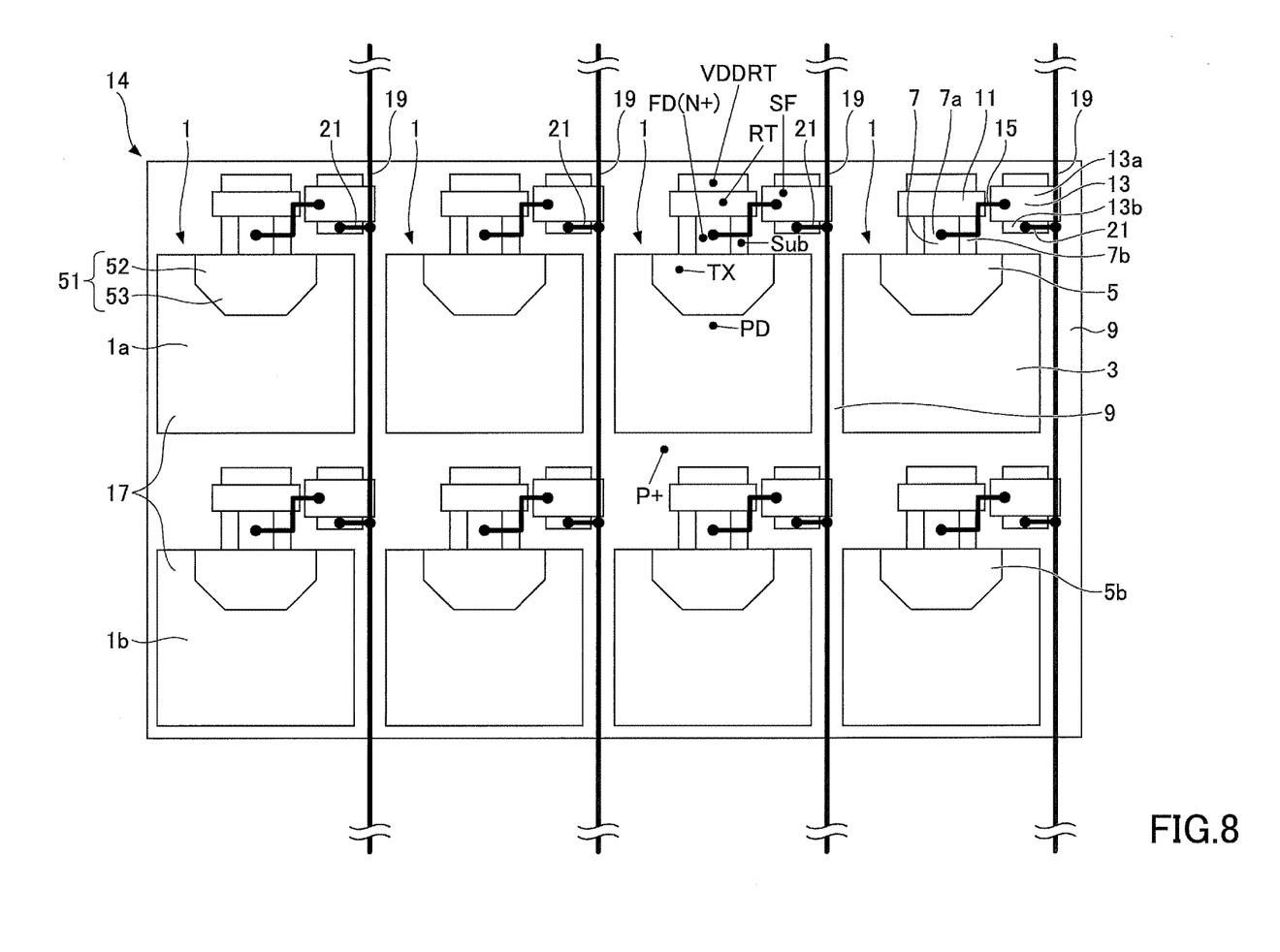
FIG. 8 is a drawing illustrating an example of part of an imaging device having pixel units illustrated in FIG. 6.

FIG. 8 is a drawing illustrating an example of the pixel unit in which the pixels of the fifth embodiment illustrated in FIG. 6 are arranged. A pixel unit 14 illustrated in FIG. 8 has a plurality of pixels 1, among which the pixels 1a and 1b are aligned in line in the vertical direction (top-and-bottom direction) in the plan view to form a pixel group 17.

Pixel groups 17 are then arranged side by side in the horizontal direction (left-and-right direction) in the plan view of FIG. 8.

Each of the pixels 1a and 1b constituting the same pixel group 17 is coupled to the same vertical signal line 19 through a metal interconnect 21. The vertical signal line 19 serves to transmit an electrical signal produced by each pixel 1 to a read-out signal processing unit (i.e., a read-out signal processing unit 27 illustrated in FIG. 9, which will be described later).

The pixel group 17 is an example of the pixel unit line. The vertical direction is an example of the first direction, and the horizontal direction is an example of the second direction perpendicular to the first direction. The vertical signal line 19 is an example of the signal line.

The alignment direction of pixels constituting the pixel group 17 and the direction in which the pixel groups 17 are arranged side by side are not limited to particular directions. Nonetheless, the pixel groups 17 each of which is made by aligning the pixels 1 in the vertical direction may be arranged side by side in the horizontal direction, thereby allowing a plurality of pixels to be arranged at high density in the pixel unit 14. Further, this arrangement also allows the length of each vertical signal line to be made short. As a result, a high-resolution solid-state imaging device is provided for which transfer characteristics are improved, and for which both sufficient light input and sufficient saturation are secured.

Although not illustrated, each pixel of the pixel group 17 may alternatively be coupled to a different vertical signal line 19 in the pixel unit 14. For example, two pixels may constitute the pixel group 17, for which two vertical signal lines are used. One of the two pixels is coupled to one of the two vertical signal lines through a metal interconnect, and the other one of the two pixels is coupled to the other one of the two vertical signal lines through another metal interconnect.

Such couplings between the pixels and the vertical signal lines allow signals to be read from the pixels simultaneously. This arrangement enables the high-speed operation of an imaging device and the improvement of transfer characteristics.

Figure 9:
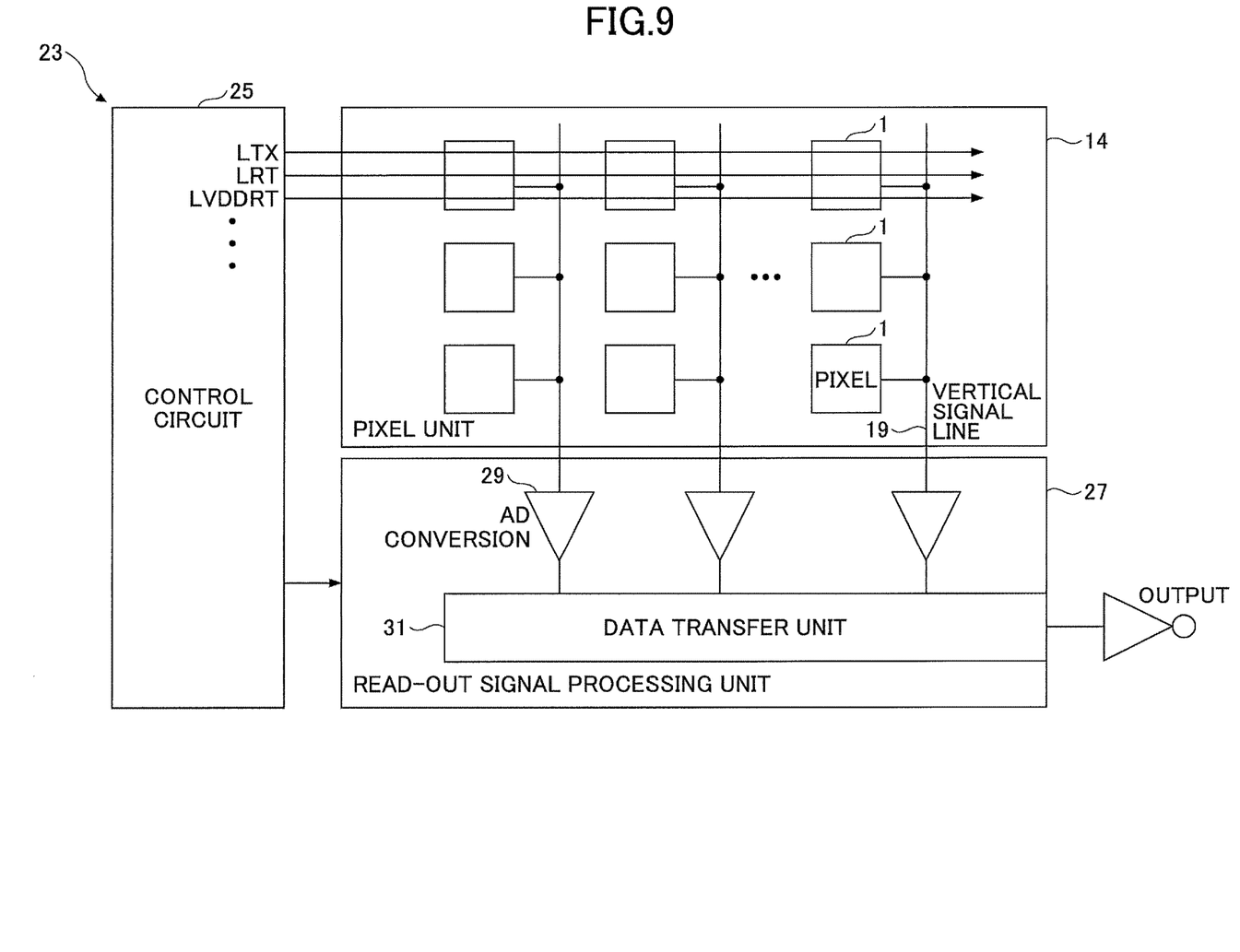
FIG. 9 is a schematic block diagram illustrating an example of the imaging device.

In the following, a description will be given of an example of the operation of the imaging device (i.e., solid-state imaging device) according to the present disclosures. FIG. 9 is a drawing illustrating an example of the schematic configuration of the imaging device (i.e., solid-state imaging device) of the present disclosures. A solid-state imaging device 23 of this example includes a control circuit 25, a pixel unit 14, and a read-out signal processing unit 27.

The control circuit 25, which is coupled to the pixel unit 14, transmits to the pixel unit 14 drive signals for driving the pixel unit 14.

The pixel unit 14 has a plurality of pixels 1 arranged therein, and serves as an example of the pixel unit used in the imaging device of the present disclosures. The pixel unit 14 is coupled to the read-out signal processing unit 27 via the vertical signal lines 19 to which each pixel 1 is coupled. The pixel unit 14 operates in response to the drive signals from the control circuit 25 so as to transmit the output signal of each pixel 1 to the read-out signal processing unit 27.

The read-out signal processing unit 27 includes read-out circuits 29 for reading the output signals of the pixels 1 and a data transfer unit 31 for transmitting the output signals read by the read-out circuits 29 to the outside as signal data.

The read-out circuits 29 may be an analog amplifier when the output signals are read as analog signals, and may be an AD conversion circuit when the output signals are read as digital signals. In this example, the read-out circuits 29 illustrated in FIG. 9 are AD conversion circuits.

The data transfer unit 31 may be an analog-output amplifier when the signals processed by the read-out signal processing unit 27 are analog signals. In the case of digital signals digitized by the AD conversion circuits or the like, a differential amplifier circuit for digital data may instead be used. In this example, a differential amplifier circuit is used as the data transfer unit 31.

Figure 10:
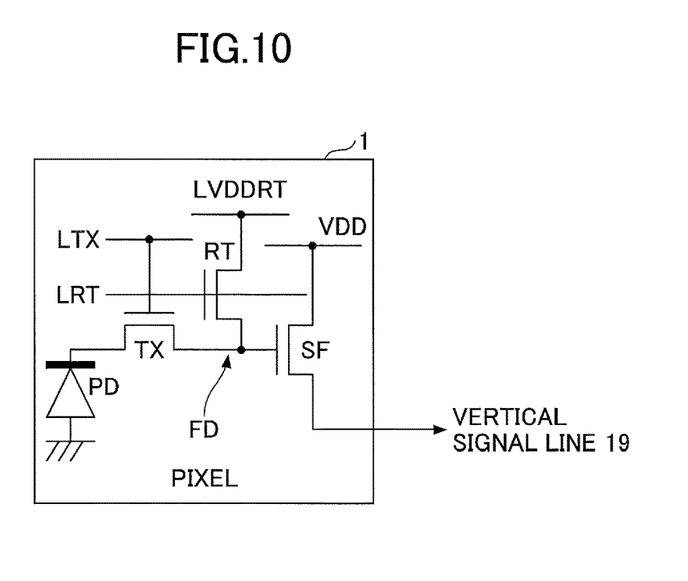
FIG. 10 is a drawing illustrating the circuit configuration of a pixel used in the pixel unit of the imaging device illustrated in FIG. 9.

FIG. 10 is a drawing illustrating the circuit configuration of the pixel 1 used in the pixel unit 14 of the imaging device illustrated in FIG. 9. The pixel 1 includes a photodiode PD, a transfer transistor TX, a reset transistor RT, an amplifier transistor SF, and a floating diffusion FD.

The pixel 1 further includes a power supply line VDD, a transfer-transistor controlling line (transfer controlling line) LTX, a reset-transistor controlling line (reset controlling line) LRT, and a power-supply controlling line LVDDRT for the reset transistor RT.

The transfer transistor TX provides a coupling between the photodiode PD and the floating diffusion FD serving as an output node. The transfer transistor TX receives a drive signal from the control circuit 25 through the transfer controlling line LTX to transfer the electric charge (or electrons) obtained through photoelectric conversion by the photodiode PD to the floating diffusion FD.

The reset transistor RT provides a coupling between the reset power-supply controlling line LVDDRT and the floating diffusion FD. The reset transistor RT has a gate thereof receiving a reset-purpose drive signal from the control circuit 25 through the reset controlling line LRT. With this arrangement, the electric potential of the floating diffusion FD is reset by the electric potential of the reset power supply LVDDRT.

The floating diffusion FD, which provides a coupling between the transfer transistor TX and the reset transistor RT, is coupled to the gate of the amplifier transistor SF.

The amplifier transistor SF is coupled to the vertical signal line 19, thereby constituting a source follower with a constant current source provided outside the pixel unit 14. The amplifier transistor SF amplifies the electric potential of the floating diffusion FD to output a voltage responsive to the potential to the vertical signal line 19. The voltage output from the pixel 1 is supplied to the read-out signal processing unit 27 through the vertical signal line 19.

The reset controlling line LRT, the transfer controlling line LTX, and the reset power-supply controlling line LVDDRT placed in the pixel unit 14 together form a set, and a set of these lines is provided for each row on which a plurality of pixels are arranged as illustrated in FIG. 9. The reset controlling line LRT, the transfer controlling line LTX, and the reset power-supply controlling line LVDDRT are driven by the control circuit 25.

Figure 11:
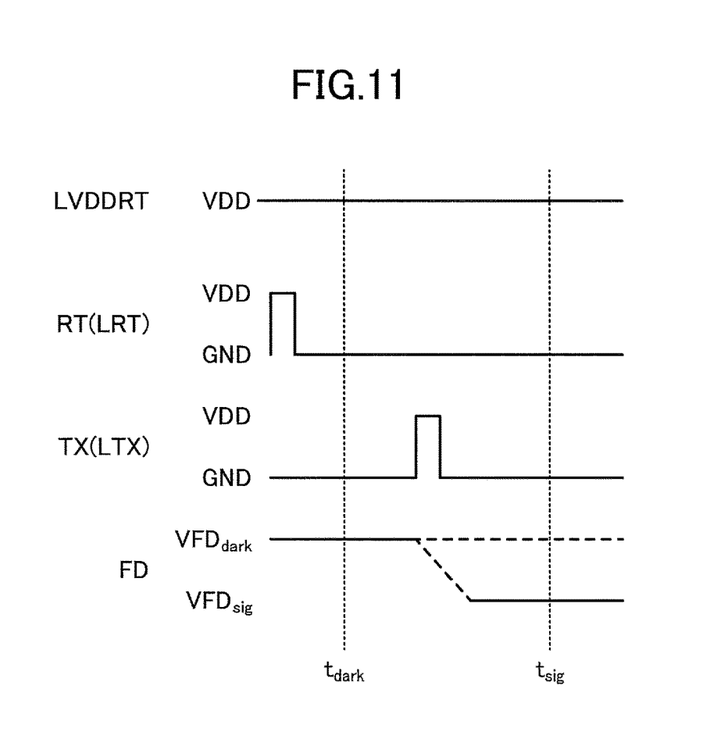
FIG. 11 is a drawing illustrating the operation timing of the pixel unit of the imaging device illustrated in FIG. 9.

In the following, a description will be given of the operation timing of a pixel used in the pixel unit of the imaging device of the present disclosures, with reference to FIG. 11. Waveforms illustrated in FIG. 11 represent the operations of the respective lines or nodes illustrated in FIG. 10. Each waveform illustrates an operation in a timeframe inclusive of the period between a read time $t_{dark}$ for reading a reset signal of the pixel 1 and a read time $t_{sig}$ for reading a signal level of the pixel 1.

The reset power-supply controlling line LVDDRT provides a power supply voltage VDD. This arrangement enables the reading of a pixel in the pixel unit 14. Subsequently, a test signal inputting gate TFD (not shown) is coupled to the ground. As a result, an amplifier transistor TSF in the test output signal unit (not shown) is disconnected from the vertical signal line, followed by reading the output signal of each pixel 1 of the pixel unit 14.

The operation of reading the output signal of the pixel 1 as described in a time sequence will be as follows. The reset controlling line LRT coupled to the gate of the reset transistor RT is set to the high-level voltage VDD before the read time $t_{dark}$ for reading a reset signal. The floating diffusion FD is thus reset to the reset potential $VFD_{dark}$.

At the read time $t_{dark}$ for reading a reset signal, the read-out signal processing unit 27 receives the output signal supplied from the amplifier transistor SF to the vertical signal line 19, thereby reading the potential level $VFD_{dark}$ of the floating diffusion FD reset by the reset voltage.

Subsequently, the transfer controlling line LTX supplies the high-level voltage VDD to the transfer transistor TX before the read time $t_{sig}$ for reading a signal level, thereby transferring the electrons (i.e., electric charge) accumulated in the photodiode PD to the floating diffusion FD (i.e., performs electric charge transfer).

At the read time $t_{sig}$ for reading a signal level, the read-out signal processing unit 27 receives the output signal supplied from the amplifier transistor SF to the vertical signal line 19, thereby reading the voltage $VFD_{sig}$ having a signal level responsive to the FD capacitance and the number of electrons transferred by the electric charge transfer.

Figure 12:
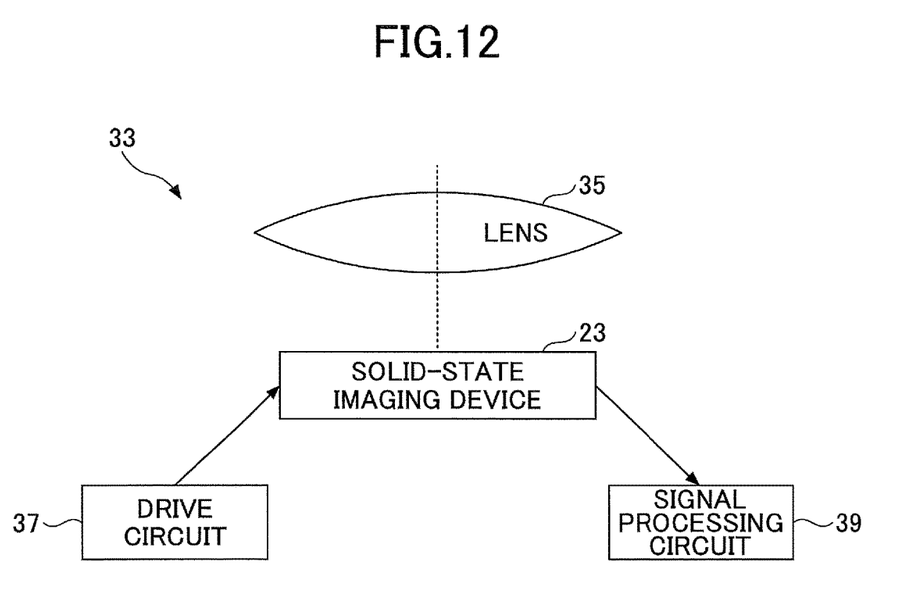
FIG. 12 is a drawing illustrating an example of a camera system in which the imaging device has the pixel unit.

FIG. 12 is a drawing illustrating an example of a camera system to which the imaging device of the present disclosures is applied. A camera system 33 illustrated in FIG. 12 includes a solid-state imaging device 23, a lens 35, a drive circuit 37, and a signal processing circuit 39. The solid-state imaging device 23 may be the imaging device illustrated in FIG. 8 and FIG. 9.

The lens 35, which constitutes a camera lens optical system, forms an image of incident light on the imaging surface of the pixel area of the solid-state imaging device 23. The drive circuit 37, which serves as a drive unit of the camera system, drives the solid-state imaging device 23. The signal processing circuit 39, which serves as a signal processing unit of the camera system, performs predetermined signal processing with respect to output signals supplied from the solid-state imaging device 23.

Image signals processed by the signal processing circuit 39 are stored in a recording medium such as a memory through an analog-digital conversion circuit (AFE) in the case of the image signals being analog outputs, or through a digital signal processing (DFE) in the case of the image signals being digital outputs. Image information stored in the recording medium may be supplied to a printer to produce a hard copy. The image signals processed by the signal processing unit may be supplied to a monitor such as a liquid display to be displayed as video images.

As described heretofore, the provision of the above-described solid-state imaging device in an imaging apparatus brings about the advantages as described (e.g., improvements in transfer characteristics while securing sufficient input light entering the photoelectric conversion element), thereby providing a high-precision camera as an imaging apparatus.

According to at least one embodiment, the transfer characteristics of an imaging device are improved while securing sufficient light input.

Although the embodiments of the present invention have been described, the present invention is not limited to these embodiments, but various variations and modifications may be made without departing from the scope of the present invention.

RELATED-ART DOCUMENTS

Patent Document

[Patent Document 1] Japanese Unexamined Patent Application Publication No. 2003-258231

What is claimed is:
1. A pixel unit, comprising:
a photoelectric conversion element;
a transfer gate abutting on the photoelectric conversion element; and
a floating diffusion region abutting on the transfer gate, wherein the transfer gate includes:
a first gate portion having a first gate width in a gate width direction, the first gate portion abutting on the floating diffusion region and extending away from the floating diffusion region in a gate length direction; and
a second gate portion having a second gate width narrower than the first gate width in the gate width direction, the second gate portion extending continuously from the first gate portion in the gate length direction,
wherein a width of the second gate portion gradually decreases from the first gate width to the second gate width toward a direction away from the first gate portion, and
wherein the transfer gate has a first edge and other edges, and the first edge and the other edges together form an entire outer perimeter of the transfer gate, the first edge being a straight edge abutting on the floating diffusion region, the other edges being fully enclosed in the photoelectric conversion element in a plan view.

2. The pixel unit according to claim 1, wherein the second gate portion is tapered.

3. The pixel unit according to claim 1, wherein the transfer gate has a plan shape made by cutting off two corners of a rectangle among four corners thereof, the two corners being situated on an opposite side of the rectangle from the floating diffusion region.

4. The pixel unit according to claim 1, wherein the photoelectric conversion element, the transfer gate, and the floating diffusion region are aligned in line.

5. The pixel unit according to claim 1, wherein the floating diffusion region includes a first diffusion region and second diffusion regions, the first diffusion region having an impurity concentration different than the second diffusion regions, and wherein the first diffusion region has a higher impurity concentration than the second diffusion regions, and the first diffusion region is situated in contact with and between the second diffusion regions.

6. The pixel unit according to claim 1, further comprising a reset transistor coupled to the floating diffusion region and configured to reset electric charge accumulated in the floating diffusion region.

7. The pixel unit according to claim 1, further comprising an amplifier transistor coupled to the floating diffusion region and configured to amplify a voltage of the floating diffusion region.

8. An imaging device comprising a plurality of pixel units each having a configuration of the pixel unit of claim 1, wherein some of the pixel units are aligned in a first direction to form any given one of a plurality of pixel unit lines, and the plurality of pixel unit lines are arranged side by side in a second direction perpendicular to the first direction.

9. The imaging device according to claim 8, wherein some of the pixel units that form one of the plurality of pixel unit lines are coupled to a same signal line configured to read electric signals from said some of the pixel units.

10. The pixel unit according to claim 1, wherein the other edges include two edges extending in the gate length direction from two ends of the first edge, respectively, the two edges being surrounded by the photoelectric conversion element in the gate width direction.

11. The pixel unit according to claim 1, wherein the floating diffusion region includes two diffusion regions, the two diffusion regions having impurity concentrations different from each other.

\* \* \* \* \*

UNITED STATES PATENT AND TRADEMARK OFFICE
CERTIFICATE OF CORRECTION

PATENT NO. : 10,186,537 B2  
APPLICATION NO. : 15/437850  
DATED : January 22, 2019  
INVENTOR(S) : Atsushi Suzuki Page 1 of 1

It is certified that error appears in the above-identified patent and that said Letters Patent is hereby corrected as shown below:

On the Title Page

Please correct Item (73) Assignee:  
Ricoh Company Ltd.  
To:  
Ricoh Company, Ltd.

Signed and Sealed this  
Sixteenth Day of April, 2019

Andrei Iancu  
*Director of the United States Patent and Trademark Office*